United States Patent
Yaegashi et al.

(10) Patent No.: US 10,211,050 B2
(45) Date of Patent: Feb. 19, 2019

(54) METHOD FOR PHOTO-LITHOGRAPHIC PROCESSING IN SEMICONDUCTOR DEVICE MANUFACTURING

(71) Applicant: TOKYO ELECTRON LIMITED, Tokyo (JP)

(72) Inventors: Hidetami Yaegashi, Tokyo (JP); Kenichi Oyama, Tokyo (JP); Masatoshi Yamato, Nirasaki (JP); Tomohiro Iseki, Koshi (JP); Toyohisa Tsuruda, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/237,840

(22) Filed: Aug. 16, 2016

(65) Prior Publication Data
US 2016/0358769 A1     Dec. 8, 2016

Related U.S. Application Data

(62) Division of application No. 14/818,409, filed on Aug. 5, 2015, now abandoned.

(30) Foreign Application Priority Data

Aug. 15, 2014  (JP) .................. 2014-165364

(51) Int. Cl.
*G03F 7/20*  (2006.01)
*G03F 7/36*  (2006.01)
(Continued)

(52) U.S. Cl.
CPC ........ *H01L 21/0273* (2013.01); *G03F 7/0045* (2013.01); *G03F 7/20* (2013.01); *G03F 7/36* (2013.01); *H01L 21/0276* (2013.01)

(58) Field of Classification Search
CPC ... G03F 7/40; G03F 7/405; G03F 1/22; H01L 21/0273; H01L 21/0274; H01L 21/31144;
(Continued)

(56) References Cited

U.S. PATENT DOCUMENTS

2002/0064958 A1* 5/2002 Takeuchi ............... G03F 7/094
                                                                   438/695
2002/0168594 A1   11/2002 Lin
(Continued)

FOREIGN PATENT DOCUMENTS

JP   2004-087689 A   3/2004
JP   2004-235468 A   8/2004
(Continued)

*Primary Examiner* — Lex H Malsawma
*Assistant Examiner* — Nduka E Ojeh
(74) *Attorney, Agent, or Firm* — Nath, Goldberg & Meyer; Jerald L. Meyer

(57) ABSTRACT

There is provided a semiconductor device manufacturing method, including: a film forming process in which, by supplying a solution for modifying a surface layer of a resist to a target object having a resist pattern and allowing the solution to infiltrate into the resist, a film having elasticity and having no compatibility with the resist is formed in the surface layer of the resist; and a heating process in which the target object having the film formed thereon is heated.

4 Claims, 12 Drawing Sheets

(51) Int. Cl.
*G03F 7/004* (2006.01)
*H01L 21/027* (2006.01)
*H01L 21/31* (2006.01)
*H01L 21/469* (2006.01)

(58) Field of Classification Search
CPC ........... H01L 21/32139; H01L 21/0337; H01L 21/0338; H01L 21/76886; H01L 21/02118; H01L 21/02318
USPC .................. 257/E21.026, E21.257, E21.314; 438/781, 694, 725, 780
See application file for complete search history.

(56) References Cited

U.S. PATENT DOCUMENTS

| | | | | |
|---|---|---|---|---|
| 2003/0082486 | A1* | 5/2003 | Endo | G03F 7/40 430/322 |
| 2004/0053511 | A1* | 3/2004 | Chandhok | G03F 7/40 438/780 |
| 2005/0214467 | A1 | 9/2005 | Domke | |
| 2009/0104558 | A1 | 4/2009 | Klaus | |
| 2010/0003622 | A1 | 1/2010 | Matsumaru | |
| 2011/0147984 | A1* | 6/2011 | Cheng | B82Y 10/00 264/220 |
| 2012/0164587 | A1* | 6/2012 | Singer | B82Y 10/00 430/326 |
| 2014/0273513 | A1* | 9/2014 | Mita | G03F 7/168 438/763 |
| 2015/0118852 | A1* | 4/2015 | Lee | H01L 21/0273 438/703 |

FOREIGN PATENT DOCUMENTS

| | | |
|---|---|---|
| JP | 2005-181758 A | 7/2005 |
| JP | 2006-091888 A | 4/2006 |
| JP | 2006-243499 A | 9/2006 |
| JP | 2012-027144 A | 2/2012 |

\* cited by examiner

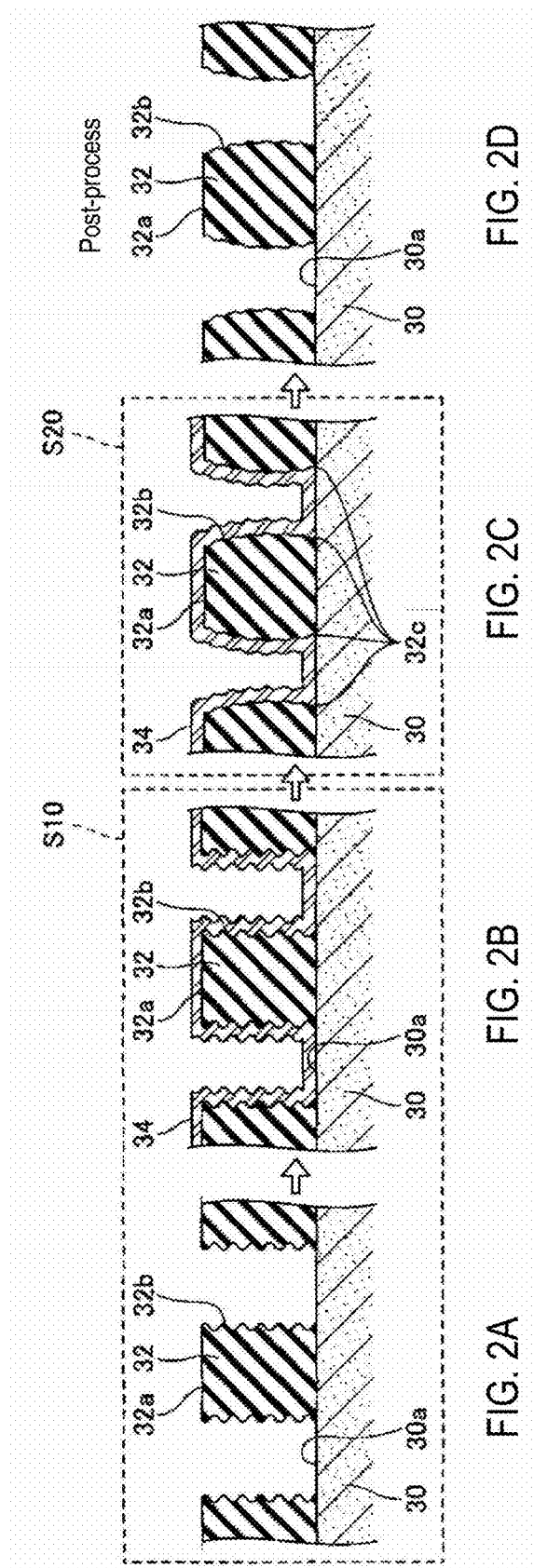

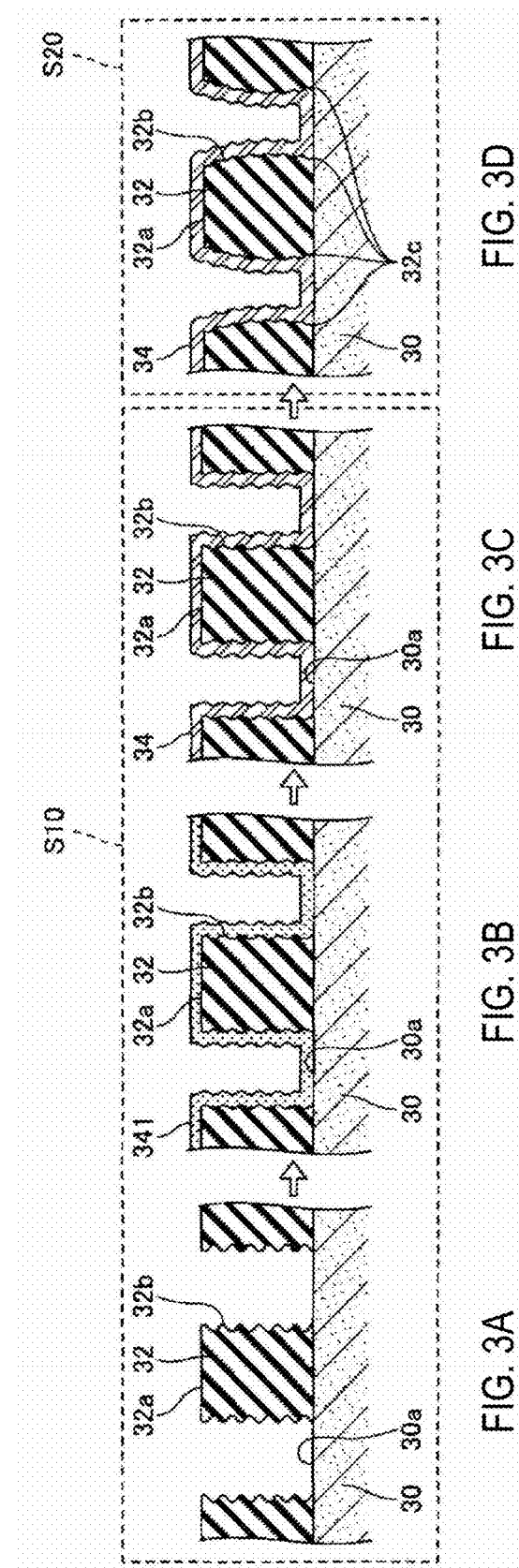

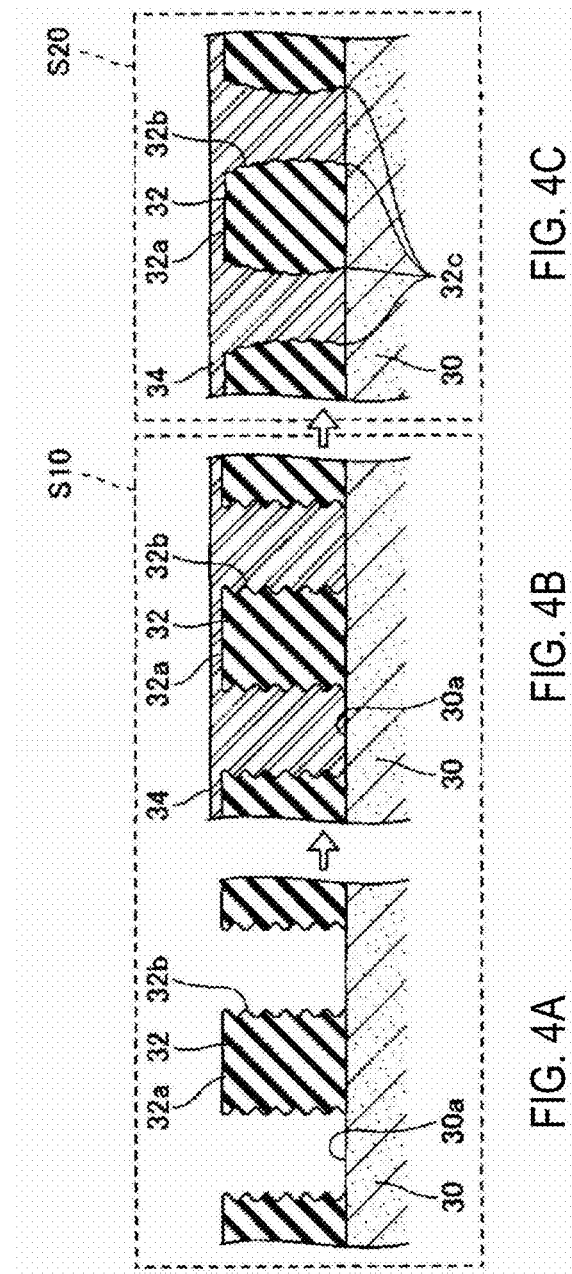

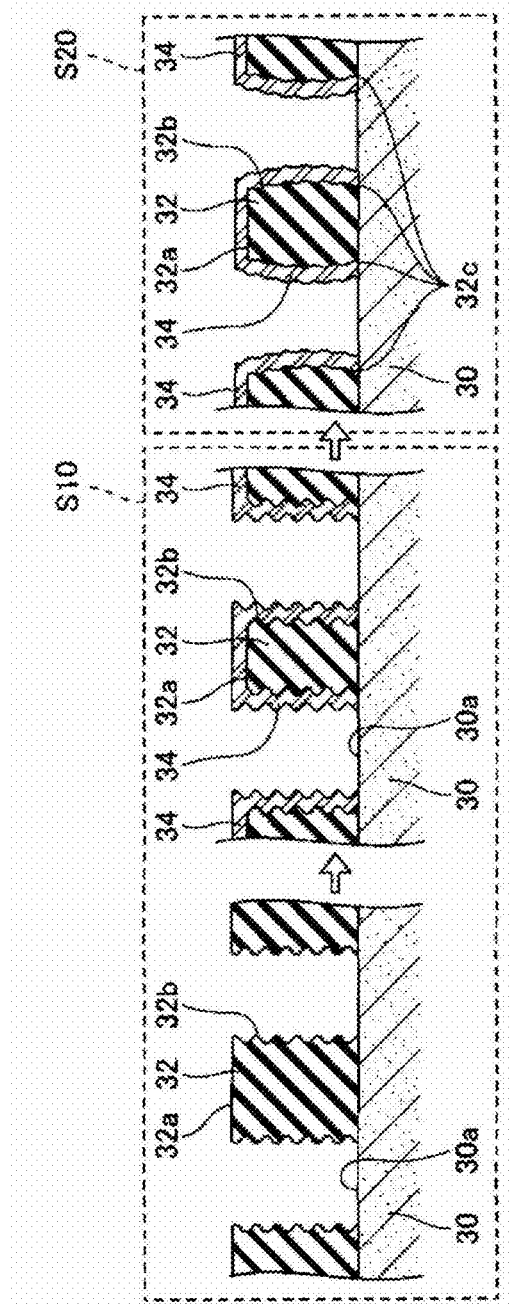

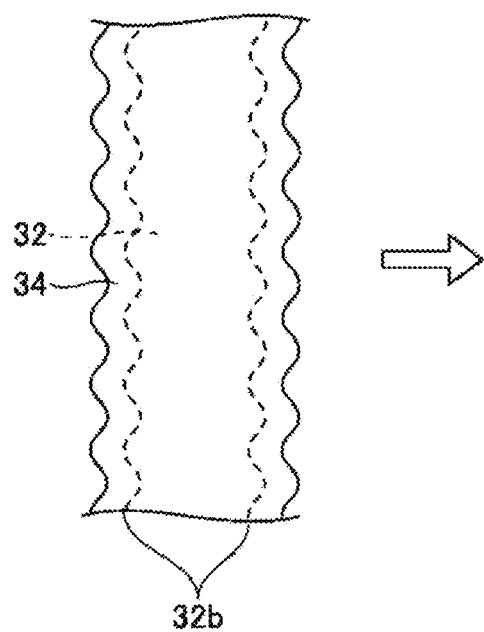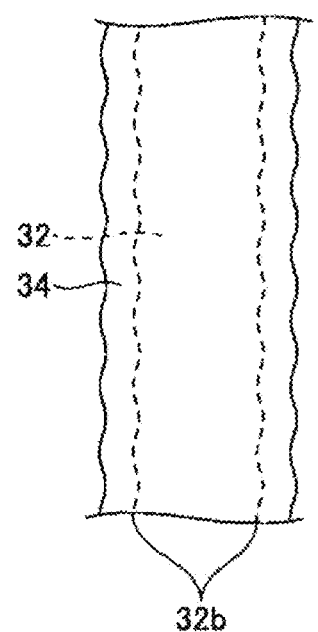

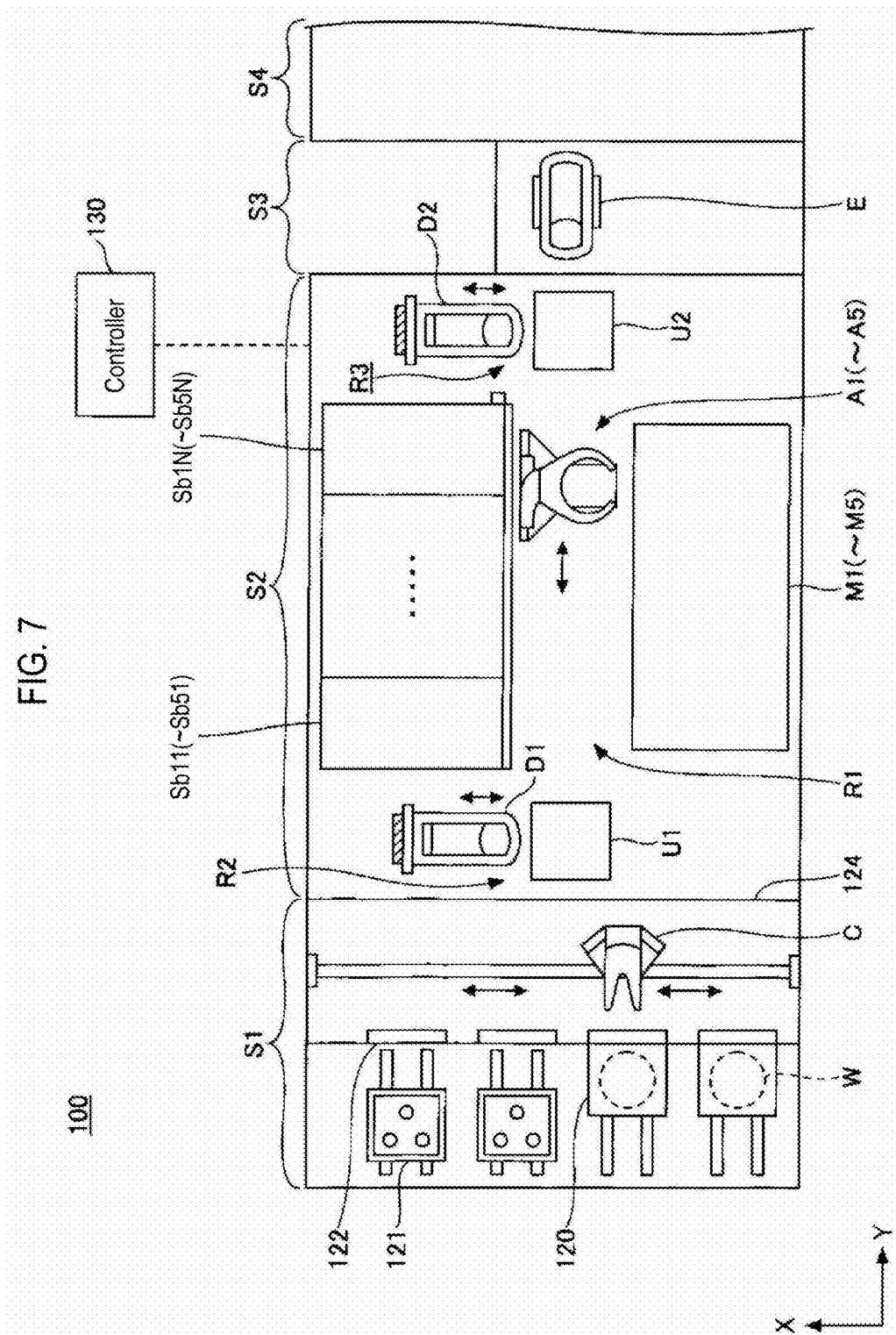

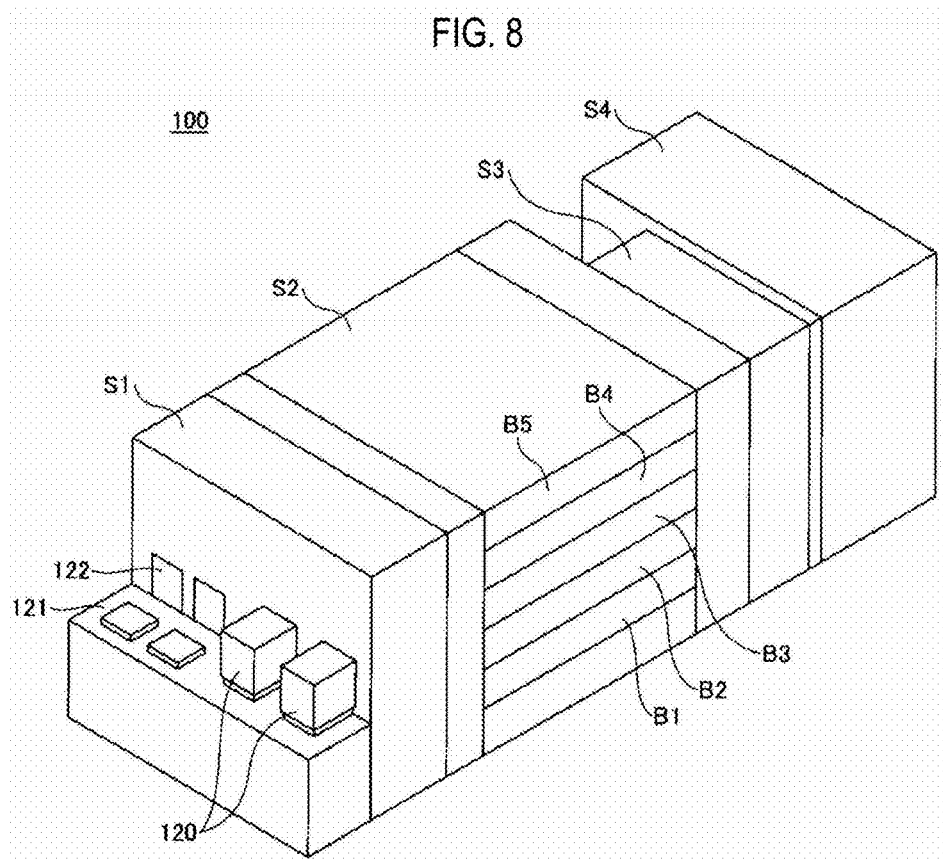

METHOD FOR PHOTO-LITHOGRAPHIC PROCESSING IN SEMICONDUCTOR DEVICE MANUFACTURING

CROSS-REFERENCE TO RELATED APPLICATION

This is a Divisional Application of U.S. patent application Ser. No. 14/818,409, filed Aug. 5, 2015, an application claiming benefit from Japanese Application No. 2014-165364, filed Aug. 15, 2014, in the Japan Patent Office, the disclosure of which is incorporated herein in its entirety by reference.

TECHNICAL FIELD

The present disclosure relates to a semiconductor device manufacturing method.

BACKGROUND

In a semiconductor device manufacturing process, a photolithography technology is used to perform a process such as etching or the like to, e.g., a semiconductor wafer (hereinafter referred to as "wafer"). Typically, in the photolithography technology, a series of processes of coating a resist solution on a base film of a wafer to form a resist film, exposing the resist film in a desired pattern and developing the resist film are performed. As one example of subsequent processes, a dry etching process is performed using the resist pattern formed by the photolithography technology as a mask to form a desired circuit pattern on the wafer.

In recent years, the demand for high integration and miniaturization of a semiconductor device has increased. Further, control of the line width (CD: Critical Dimension) constituting a circuit within a plane of a wafer grows important and miniaturization is also requested in forming a resist pattern.

In a technology of miniaturizing a resist pattern, the line width of the resist pattern must be controlled and there must be improvement in parameters such as the LER (Line Edge roughness) indicative of a degree of irregularity of a sidewall of a resist line pattern, the LWR (Line Width Roughness) indicative of a degree of variation of a line width, the CER (Contact Edge Roughness) indicative of a degree of irregularity of a sidewall of a resist hole pattern, and the like.

However, in the aforementioned conventional technology, the characteristics required in the resist pattern are not sufficient.

SUMMARY

Some embodiments of the present disclosure provide a manufacturing method of a semiconductor device which enables a resist pattern to be superior in a roughness characteristic and a line width characteristic.

According to one embodiment of the present disclosure, there is provided a semiconductor device manufacturing method, including: a film forming process in which, by supplying a solution for modifying a surface layer of a resist to a target object having a resist pattern and allowing the solution to infiltrate into the resist, a film having elasticity and having no compatibility with the resist is formed in the surface layer of the resist; and a heating process in which the target object having the film formed thereon is heated.

According to another embodiment of the present disclosure, there is provided a semiconductor device manufacturing method, including: a film forming process in which, by supplying a gas for modifying a surface layer of a resist to a target object having a resist pattern and allowing the gas to infiltrate into the resist, a film having elasticity and having no compatibility with the resist is formed in the surface layer of the resist; and a heating process in which the target object having the film formed thereon is heated.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 2A to 2D are schematic views for explaining the flow of the semiconductor device manufacturing method according to the present embodiment.

FIGS. 3A to 3D are schematic views for explaining the flow of the semiconductor device manufacturing method according to the present embodiment.

FIGS. 4A to 4C are schematic views for explaining the flow of the semiconductor device manufacturing method according to the present embodiment.

FIGS. 5A to 5C are schematic views for explaining the flow of the semiconductor device manufacturing method according to the present embodiment.

FIGS. 6A and 6B are schematic views for explaining a heating process according to the present embodiment.

FIG. 7 is a schematic plan view showing one example of a semiconductor manufacturing apparatus according to the present embodiment.

FIG. 8 is a schematic perspective view showing one example of the semiconductor manufacturing apparatus according to the present embodiment.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

(Semiconductor Device Manufacturing Method)

Figure 1:
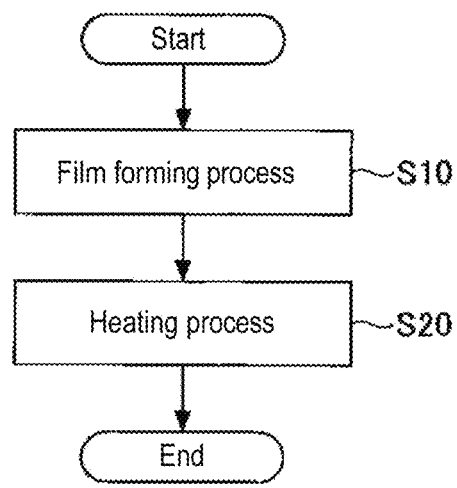
FIG. 1 is a flowchart showing one example of a semiconductor device manufacturing method according to the present embodiment.

First, a description will be made on a semiconductor device manufacturing method according to the present embodiment. FIG. 1 is a flowchart showing one example of a semiconductor device manufacturing method according to the present embodiment.

As shown in FIG. 1, the semiconductor device manufacturing method according to the present embodiment includes: a film forming process S10 in which a film having elasticity and having no compatibility with a resist is formed to cover a surface of the resist patterned on a target object; and a heating process S20 in which the target object having the film formed thereon is heated.

The semiconductor device manufacturing method according to the present embodiment may further include other miscellaneous processes. Examples of other processes may include a cooling process in which the heated target object is cooled and a film removal process in which the film is removed from the heated target object.

The respective processes will be described in detail with reference to FIGS. 2A to 5C. In the present embodiment, a description will be made on a case where the resist pattern is formed into a line pattern. However, since the same technology can be applied to a hole pattern, the present disclosure is not limited in this respect.

In FIGS. 2A to 5C, schematic views are shown to explain the flow of the semiconductor device manufacturing method according to the present embodiment.

[Film Forming Process (S10)]

As set forth above, the film forming process is a process in which a film 34 having elasticity and having no compatibility with a resist 32 is formed so as to cover a surface of the resist 32 (sometimes referred to as "resist pattern 32") previously patterned on a target object 30 (see FIGS. 2B, 3C, 4B and 5B).

In the present embodiment, the expression "to cover a surface of the resist 32" means that the film 34 covers an upper surface 32a and a side surface 32b of the resist 32. In this case, as shown in FIGS. 2B and 3C, only a portion of a space existing between the resist patterns 32 adjoining each other may be filled with the film 34, while, as shown in FIG. 4B, the entire space existing between the resist patterns 32 adjoining each other may be filled with the film 34. Furthermore, as shown in FIG. 5B, if the surface of the resist 32 is covered with the film 34, an exposed portion 30a on which no resist 32 is formed may not be completely covered with the film. However, in some embodiments the film 34 is formed to completely cover the exposed portion 30a, which will be further discussed with respect to the heating process (S20).

There are no particular restrictions with respect to the target object 30. For example, a substrate or a substrate having one or more base layers formed thereon may be used as the target object 30.

The material for the base layers is not particularly limited and may be an organic BARC (Bottom Anti-Reflective Coating) film (including a Si-containing film), a TEOS (tetraethoxysilane) film, an SOG (Spin-On-Glass) film, an SiON film or an LTO (Low Temperature Oxide) film.

A brief description will be made on one example of a method of forming the resist pattern 32 on the target object 30, which is shown in FIGS. 2A, 3A, 4A and 5A. First, the resist 32 is coated on the target object 30 by, e.g., a spin-on operation which is performed using a coating/developing apparatus provided with an exposure device therein. The target object 30 coated with the resist 32 is subjected to a pre-bake process in order to remove a solvent existing in the resist 32 and to uniformly disperse resist molecules. Thereafter, the resist 32 is exposed in a specified pattern by a photolithography technology. Prior to the exposure process, an extra resist may be removed by a peripheral exposure process. The exposed target object 30 is subjected to a post-exposure baking (PEB) process in order to diffuse photosensitive areas, after which a developing process is performed. The developed target object 30 is subjected to a post-bake process in order to improve the adhesion of the resist 32. As a result, a resist pattern 32 is formed. As mentioned above, in the present embodiment, the resist pattern 32 may be either a hole pattern or a line pattern. Moreover, the thickness of the resist 32 or the pitch of the patterned resist 32 is not particularly limited and may be suitably selected by an ordinary skilled in the art.

With respect to the target object 30 having the resist pattern 32 formed thereon, in the film forming process S10 of the present embodiment, as shown in FIGS. 2B, 3C, 4B and 5B, a film 34 having elasticity and having no compatibility with the resist 32 is formed to cover the surface of the resist 32.

The method of forming the film 34 is not particularly limited as long as the method can form the film 34 having elasticity and having no compatibility with the resist 32. For example, as shown in FIGS. 2A to 4C, one film forming method may be a method in which the film 34 is formed on the surface of the resist 32 by placing a material for the film 34 on the surface of the resist 32. Furthermore, as shown in FIGS. 5A to 5C, it may be possible to use a film forming method in which the film 34 is formed on the surface of the resist 32 by modifying a surface layer of the resist 32.

First, a description will be made on the film forming method in which the film 34 is formed on the surface of the resist 32 by placing a material for the film 34 on the surface of the resist 32.

Examples of the film forming method in which the film 34 is formed on the surface of the resist 32 by placing a material for the film 34 on the surface of the resist 32 may include a spin coating method, a mist coating method, a vapor deposition method, a vapor deposition polymerization method and an electroless plating method.

In a case where the film 34 is formed by the spin coating method, a precursor solution as a material for the film 34 is coated on the target object 30 having the resist pattern 32 formed thereon. Then, the film 34 can be formed by a sol-gel method or the like. In this case, the film 34 is not particularly limited as long as the film 34 has elasticity and has no compatibility with the resist 32. Examples of the film 34 may include an organic silicon compound film, a metal organic compound film and a mixture film thereof. Examples of the precursor solution for forming the organic silicon compound film may include a precursor solution which contains a silicon alkoxide compound, a silicon chelate compound, a silicon acylate compound, a silicon isocyanate compound, an amine-based organic silicon compound and/or a silane coupling agent. Furthermore, examples of the precursor solution for forming the metal organic compound film may include a precursor solution which contains a metal alkoxide compound, a metal chelate compound, a metal acylate compound, an amine-based metal organic compound and/or a metal isocyanate compound. In some embodiments, the metal compound contained in the precursor solution is a metal compound mainly composed of titanium, zirconium, tungsten, aluminum, tantalum, hafnium, copper or palladium.

Furthermore, in a case where the film 34 is formed by the spin coating method, the film 34 can be formed by coating an aqueous solution of a material for the film 34 on the target object 30 having the resist pattern 32 formed thereon and drying the aqueous solution. In this case, the film 34 is not particularly limited as long as the film 34 has elasticity and has no compatibility with the resist 32. Examples of the film 34 may include a water-soluble polymer such as polyvinyl alcohol, sodium polyacrylate, polyacrylamide, polyethylene imine, polyethylene oxide, polyvinyl pyrrolidone or the like. Examples of the aqueous solution for forming a film of the water-soluble polymer may include an aqueous solution containing the water-soluble polymer.

In a case where the film 34 is formed by the mist coating method, a coating film 341 is formed (see FIG. 3B) by spraying a misted solution of a material for the film 34 (hereinafter referred to as "misted solution") on the target object 30 having the resist pattern 32 formed thereon (see FIG. 3A). Thereafter, the coating film 341 is dried to volatilize a solvent, whereby a solute of the misted solution forms the film 34 (see FIG. 3C). In this case, the film 34 is not particularly limited as long as the film 34 has elasticity and has no compatibility with the resist 32. Examples of the film 34 may include an organic silicon compound film, a metal organic compound film and a mixture film thereof. Examples of the precursor solution for forming the organic silicon compound film may include a precursor solution which contains a silicon alkoxide compound, a silicon chelate compound, a silicon acylate compound, a silicon isocyanate compound, an amine-based organic silicon compound and/or a silane coupling agent. Furthermore, examples of the precursor solution for forming the metal organic compound film may include a precursor solution which contains a metal alkoxide compound, a metal chelate compound, a metal acylate compound, an amine-based metal organic compound and/or a metal isocyanate compound.

In some embodiments, the metal compound contained in the precursor solution is a metal compound mainly composed of titanium, zirconium, tungsten, aluminum, tantalum, hafnium, copper or palladium.

As the misted solution, a solution having compatibility with the resist 32 are used in some embodiments. In this case, the amount of the misted solution adhering to the resist pattern 32 is adjusted such that only the surface layer of the resist pattern 32 is dissolved in the misted solution. This makes it possible to lower the roughness of the resist pattern 32 to some extent prior to performing the heating process (S20) to be described later.

In a case where the film 34 is formed by the vapor deposition method, it is possible to form the film 34 by supplying a gas-phase precursor of a material for the film 34 to the target object 30 having the resist pattern 32 formed thereon. In this case, the film 34 is not particularly limited as long as the film 34 has elasticity and has no compatibility with the resist 32. Examples of the film 34 may include an organic silicon compound film, an metal organic compound film and a mixture film thereof. Examples of the precursor for forming the organic silicon compound film may include a precursor gas which contains a silicon alkoxide compound, a silicon chelate compound, a silicon acylate compound, a silicon isocyanate compound, an amine-based organic silicon compound and/or a silane coupling agent. Furthermore, examples of the precursor for forming the metal organic compound film may include a precursor gas which contains a metal alkoxide compound, a metal chelate compound, a metal acylate compound, an amine-based metal organic compound and/or a metal isocyanate compound. In some embodiments, the metal compound contained in the precursor gas is a metal compound mainly composed of titanium, zirconium, tungsten, aluminum, tantalum, hafnium, copper or palladium.

In a case where the film 34 is formed by the vapor deposition polymerization method, for example, a material (a first source monomer and a second source monomer) filled in an evaporation boat is heated such that the vapor of the first source monomer and the vapor of the second source monomer fly in an equimolar amount at the same time or such that the vapor of the first source monomer and the vapor of the second source monomer fly in an equimolar amount at different times through the use of a shutter or the like. Thus, the first source monomer and the second source monomer are vapor-deposited on and polymerized with the target object 30 having the resist pattern 32 formed thereon. In this manner, the film 34 can be formed on the target object 30 having the resist pattern 32 formed thereon. In this case, the film 34 is not particularly limited as long as the film 34 has elasticity and has no compatibility with the resist 32. Examples of the film 34 may include a polyimide film, a polyamide film, a polyazomethine film, a polyurea film and a mixture film thereof. Examples of the material for forming the film 34 may include a combination of aromatic diamine and tetracarboxylic acid dianhydride. In addition to these materials, it may be possible to use a silane coupling agent.

The formation of the film using the vapor deposition method and the vapor deposition polymerization method may be performed under normal pressure or under a vacuum. These methods are advantageous in that they can easily form a conformal film 34 on the resist pattern 32, regardless of height or width of the resist 32.

In some embodiments, the film 34 formed by the film forming methods illustrated above is conformally formed on the pattern of the resist 32. If the conformal film 34 is formed, as compared with a case where the space existing between the adjoining resist patterns 32 is filled with the film 34, the shape of the film 34 is easily deformed in conformity with the deformation of the resist 32 in the heating process (S20) described later. This makes it possible to effectively improve the LER and the LWR.

Next, a description will be made on the film forming method in which the film 34 is formed on the surface of the resist 32 by modifying the surface layer of the resist 32.

Examples of the film forming method in which the film 34 is formed on the surface of the resist 32 by modifying the surface layer of the resist 32 may include infiltration such as silylation or the like, and deprotection.

Using the film forming method in which the film 34 is formed on the surface of the resist 32 by modifying the surface layer of the resist 32, is advantageous in that a process of removing the film 34 need not be performed prior to an etching process since the film 34 is formed on only the surface layer of the resist pattern 32 and is not formed on the exposed portion 30a.

In a case where the film 34 is formed by infiltration, the film 34 can be formed by supplying a solution, for modifying the surface layer of the resist 32 into the film 34, to the target object 30 having the resist pattern 32 formed thereon and allowing the solution to infiltrate into the resist 32. In this case, the film 34 is not particularly limited as long as the film 34 has elasticity and has no compatibility with the resist 32. Examples of the film 34 may include a metal organic compound. Examples of the solution may include a solution which contains a metal alkoxide compound, a metal chelate compound, a metal acylate compound, an amine-based metal organic compound and/or a metal isocyanate compound. In some embodiments, the metal compound contained in the solution is a metal compound mainly composed of titanium, zirconium, tungsten, aluminum, tantalum, hafnium, copper or palladium.

In a case where the film 34 is formed by the silylation, a film 34 composed of an organic silicon compound can be formed by coating a silylating agent, for modifying the surface layer of the resist 32 into the film 34, on the target object 30 having the resist pattern 32 formed thereon. Examples of the silylating agent may include compounds having a siloxane structure. Among them, a siloxane compound having an amino group may be used. Examples of the siloxane compound may include aminosiloxane, diaminosiloxane and bisaminopropyl polydimethylsiloxane.

Furthermore, in a case where the film 34 is formed by the silylation, a film 34 composed of an organic silicon compound can be formed by supplying a gas which contains a silylating agent, for modifying the surface layer of the resist 32 into the film 34, to the target object 30 having the resist pattern 32 formed thereon. Examples of a gas which contains the silylating agent may include DMSDMA (dimethyl silane dimethylamine), DMSDEA (dimethyl silane diethylamine), TMSDMA (trimethylsilane dimethylamine), TMSDEA (trimethylsilane diethylamine), HMDS (hexamethyldisilazane), and TMDS (tetramethyldisilazane).

When forming the film by the infiltration such as the silylation or the like, the volume of the resist 32 is expanded while the surface area thereof varies in a small range, so that the resist 32 is smoothened. This makes it possible to reduce the roughness of the resist pattern 32 to some extent prior to performing the heating step (S20) described later.

In a case where the film 34 is formed by the deprotection, it is possible to form the film 34 by exposing the target object 30 having the resist pattern 32 formed thereon or by supplying an acid generating agent to the target object 30. In this case, the film 34 is not particularly limited as long as the film 34 has elasticity and has no compatibility with the resist 32. Examples of the film 34 may include a resist surface layer whose glass transition temperature Tg after being deprotected is higher than that before deprotection. The light used in the exposure is not particularly limited as long as the wavelength thereof is shorter than the wavelength of the light used in patterning the resist 32. In some embodiments, the light used in the exposure has a wavelength of, e.g., 184 nm, 172 nm, 157 nm, 146 nm or 126 nm. This makes it possible to modify only the surface layer of the resist pattern 32. Examples of the acid generating agent may include an acidic solution such as an onium salt solution or the like.

The film formation using the deprotection is advantageous in that, unlike the film formation by the infiltration, no expansion of the resist pattern 32 occurs and in that the variation in dimension of the resist pattern 32 is relatively small.

[Heating Process (S20)]

The heating process is a process in which the target object 30 having the film 34 formed thereon is heated as shown in FIGS. 2C, 3D, 4C and 5C.

FIGS. 6A and 6B are schematic views for explaining the heating process according to the present embodiment. More specifically, FIG. 6A is a top plan view of the resist 32 available after (immediately after) the film forming process, while FIG. 6B is a top plan view of the resist 32 available after the heating process.

As shown in FIG. 6A, the side surface 32b of the resist 32 available immediately after the film forming process has an irregularity. Presumably, this is attributable to the wave nature of the light which is irradiated on the target object 30 during the exposure to form the resist pattern 32.

In the present embodiment, the heated resist 32 is violent in the thermal motion of molecules thereof and is thermally expanded. In addition, the rigidity and the viscosity of the heated resist 32 are reduced, as a result of which the fluidity of the heated resist 32 increases. The resist 32 having the increased fluidity tends to be deformed into a shape in which the energy state becomes more stable and the surface area becomes smaller. Therefore, the side surface 32b of the resist 32 is smoothened. At this time, the contact portions 32c of the film 34, the target object 30 and the resist 32 remain fixed. For that reason, even if the fluidity of the resist 32 increases, trailing in the resist pattern 32 does not occur. As a result, the resist 32 can be smoothened while maintaining the pitch width between the adjoining resists 32. That is to say, it can be said that the semiconductor device manufacturing method according to the present embodiment is a process in which the variation of the line width of the resist pattern 32 is small before and after the process. In order to securely fix the contact portions 32c, the film 34 is formed, in some embodiments, so as to completely cover the exposed portion 30a of the target object 30.

Since the film 34 has elasticity, the film 34 is smoothened in conformity with the smoothening of the resist 32. As a result, the resist 32 is deformed from the state shown in FIG. 6A to the state shown in FIG. 6B such that the roughness of the side surface 32b is made smooth. It is therefore possible to form a resist pattern which is small in the LER and the LWR or the CER.

The heating method is not particularly limited. For example, resistance heating such as heater heating or the like, radiation heating such as lamp heating or the like, induction heating, or dielectric heating may be used as the heating method.

The heating temperature of the resist 32 is not particularly limited as long as the heating temperature is lower than a temperature at which the resist 32 is carbonized. In some embodiments the heating temperature is equal to or higher than the glass transition point of the resist 32. For example, if the glass transition point of the resist 32 is 150 degrees C., the resist 32 may be heated to a temperature of about 150 degrees C. to about 300 degrees C. in some embodiments. Heating the resist 32 to a temperature equal to or higher than the glass transition point thereof allows the fluidity of the resist 32 to become higher thereby increasing the smoothening effect.

[Other Processes]

The semiconductor device manufacturing method according to the present embodiment may further include other processes in addition to the aforementioned processes. Examples of other processes may include a cooling process which cools the target object subjected to the heating process and a film removal process which removes the film from the target object subjected to the heating process.

Regardless of the semiconductor device manufacturing method according to the present embodiment, it is typical in the course of manufacturing a semiconductor device to convey the heated target object 30 to the next process after cooling the target object 30. In this case, the target object 30 may be naturally cooled. However the target object 30 may be cooled through the use of a cooling module in some embodiments. Particularly, in a case where a chemically-amplified resist is used as the resist 32, a problem of the developed line width bulging would occur unless the heated target object 30 is rapidly cooled. As the cooling module, it may be possible to use a well-known hot/cooling plate (CHP) unit which is used in forming a resist.

The semiconductor device manufacturing method according to the present embodiment may further include a film removal process. In manufacturing a semiconductor device, the target object 30 having the resist 32 formed thereon is subjected to a dry etching process using the resist pattern 32 as a mask. In a case where a conformal film 34 is formed in the film forming process, as shown in FIG. 2D, the film 34 is removed by the dry etching process. Thereafter, the exposed base film (the target object 30) may be similarly etched using, as a mask, the resist 32 exposed by the removal of the film 34.

Instead of the method of removing the film 34 by the dry etching, a wet etching process using a chemical agent may be used to remove the film 34. As a cleaning liquid for the removal of the film 34, it may be possible to use water, an acidic aqueous solution such as hydrofluoric acid or the like, or an organic solvent such as alcohol or the like.

(Semiconductor Manufacturing Apparatus)

Next, a semiconductor manufacturing apparatus capable of implementing the semiconductor device manufacturing method according to the present embodiment will be described with reference to FIGS. 7 to 9. A description will be made here by taking, as an example, a semiconductor manufacturing apparatus which includes a resist pattern forming module for implementing a series of processes from a resist solution coating process to a developing process, a film forming module for forming a film on a target object, and a heating module for thermally treating a resist.

FIG. 7 is a schematic plan view showing one example of the semiconductor manufacturing apparatus according to the present embodiment. FIG. 8 is a schematic perspective view of the semiconductor manufacturing apparatus. FIG. 9 is a schematic side view of the semiconductor manufacturing apparatus. In the following description, the X-axis direction in FIG. 7 will be referred to as the left-right direction of the apparatus. The Y-axis direction in FIG. 7 will be referred to as the front-rear direction of the apparatus. The upper side in the X-axis direction in FIG. 7 will be referred to as the left side. The lower side in the X-axis direction in FIG. 7 will be referred to as the right side. The below-mentioned S1 side of the apparatus in the Y-axis direction will be referred to as the front side. The below-mentioned S4 side of the apparatus in the Y-axis direction will be referred to as the rear side.

The semiconductor manufacturing apparatus 100 according to the present embodiment includes a carrier block S1, a processing block S2, an interface block S3 and an exposure device S4.

The carrier block S1 is a region into and out of which a carrier 120 accommodating one wafer W or a plurality of wafers W as one example of a target object or target objects is carried. In the carrier block S1, there are installed mounting tables 121 capable of mounting a plurality of carriers 120 thereon, opening/closing units 122 installed on a wall surface existing at the rear side (in the Y-axis direction in FIG. 7) of the mounting tables 121, and a transfer arm C.

The transfer arm C is capable of carrying the wafer W into and out of the carriers 120 through the opening/closing units 122 and is configured to move forward and backward, move up and down, and rotate about a vertical axis.

The processing block S2, around which a housing 124 surrounds, is connected to the rear side of the carrier block S1.

In the processing block S2, a plurality of unit blocks is disposed in the vertical direction. In the embodiment illustrated in FIG. 8, a first unit block B1 for performing a coating process of a resist solution, a second unit block B2 for performing a developing process of a resist film, a third unit block B3 for performing the aforementioned film forming process of the present embodiment, a fourth unit block B4 for heating a wafer having a film formed thereon and a fifth unit block B5 for removing the film are disposed in the named order from the lower side. However, the semiconductor manufacturing apparatus 100 according to the present embodiment is not limited to the aforementioned configuration. For example, the fourth unit block B4 for heating a wafer having a film formed thereon may be installed as a below-mentioned sub-module of the third unit block B3. Moreover, other unit modules may be additionally disposed. For example, another unit block for forming a base film such as an anti-reflective film or the like on the wafer W may be disposed. In addition, the unit blocks B1 to B5 may be disposed in an order different from the aforementioned order.

A transport region R1 of the wafer W which interconnects the carrier block S1 and the interface block S3 and which extends in the front-rear direction of the processing block S2 is formed substantially at the center of the processing block S2.

As one example, main modules M1 to M5 which correspond to the unit blocks B1 to B5 and which implement main processes are disposed at the right side of the transport region R1. Furthermore, one or more sub-modules Sb11 to Sb5N (where N is an integer of 1 or more) which implement a sub-process such as heating or cooling before and after the main processes implemented by the respective main modules are disposed at the left side of the transport region R1. The sub-modules Sbx1 to SbxN corresponding to the main modules Mx may be disposed at multiple stages in a shelf-like form along the vertical direction or may be serially arranged in the front-rear direction of the processing block S2.

Specific examples of the sub-modules Sb11 to Sb5N may include an alignment unit (ALIM) which performs position alignment of the wafer W, an extension unit (EXT) which performs carry-in and carry-out of the wafer W, a hot plate unit (HP) which performs a heating process such as pre-baking of the wafer W or the like after coating a resist solution, a cooling plate unit (COL) which performs a cooling process, a hot/cooling plate unit (CHP) which performs a heating process and a cooling process with respect to the wafer W, a hydrophobic treatment unit (AD) which enhances adhesion between the resist solution and the wafer W, and a peripheral edge exposure device which selectively exposes only the edge portion of the wafer W. Since well-known units may be used as the respective sub-modules, a description on the detailed structure of the sub-modules will be omitted in the subject specification.

Main arms A1 to A5 are disposed in the transport region R1. The respective main arms A1 to A5 are configured to perform delivery of the wafer W between all the modules disposed within the respective unit blocks B1 to B5. The respective main arms A1 to A5 are configured such that they can move forward and backward, move up and down and rotate about a vertical axis.

A region existing between the transport region R1 and the carrier block S1 is a delivery region R2. As shown in FIG. 7, a shelf unit U1 is installed in the delivery region R2 at a position to which the transfer arm C and the respective main arms A1 to A5 can gain access. Furthermore, a delivery arm D1 for delivering the wafer W with respect to the shelf unit U1 is installed in the delivery region R2.

Figure 9:
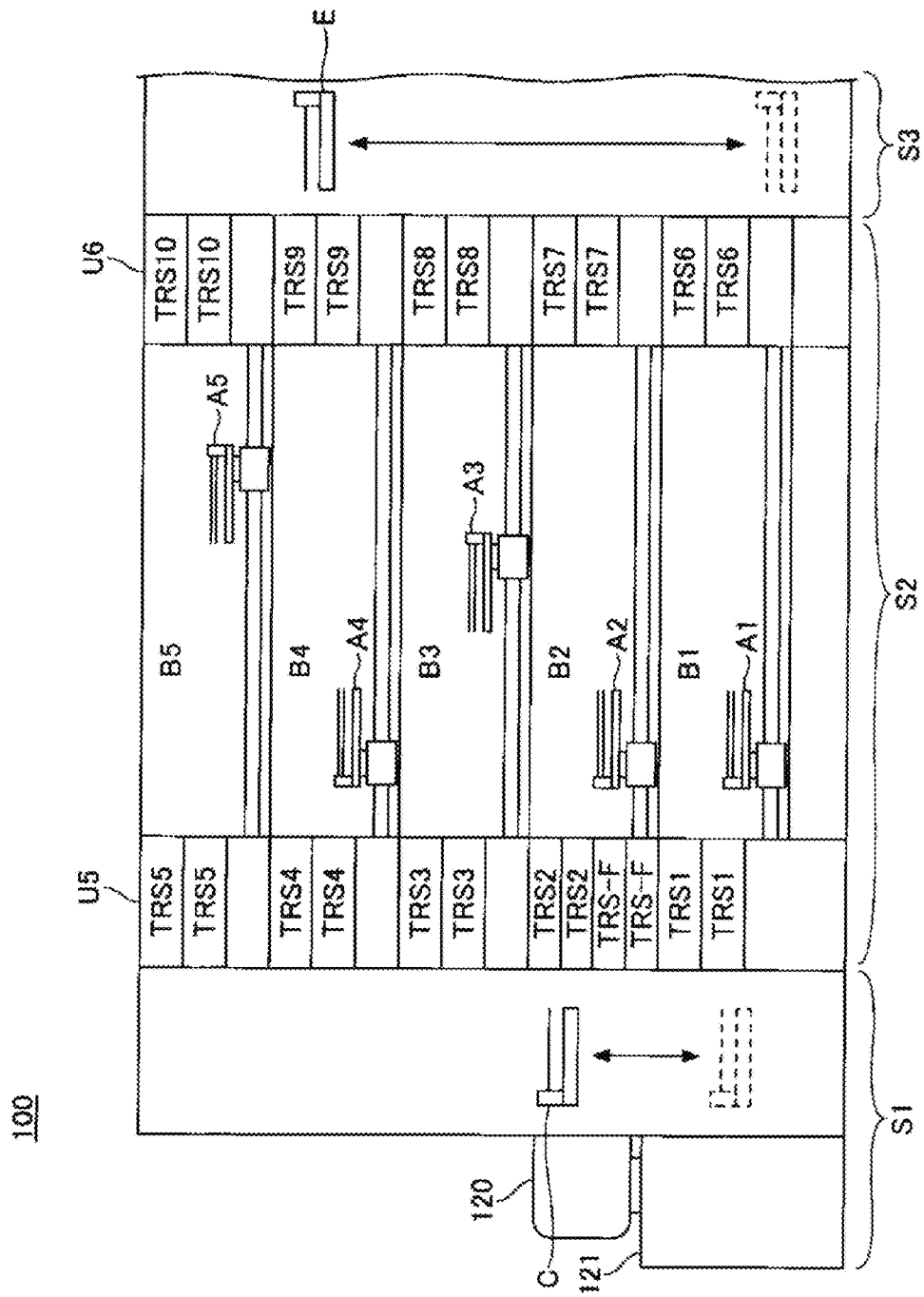
FIG. 9 is a schematic side view showing one example of the semiconductor manufacturing apparatus according to the present embodiment.

As shown in FIG. 9, delivery stages TRS1 to TRS5 are installed in the shelf unit U1 such that the wafer W can be delivered between the delivery stages TRS1 to TRS5 and the main arms A1 to A5 of the respective unit blocks B1 to B5. In the example shown in FIG. 9, one or more, e.g., two, delivery stages are installed with respect to each of the unit blocks B1 to B5. There is formed a delivery stage group in which the delivery stages are stacked at multiple stages.

The delivery arm D1 is configured to move forward and backward and to move up and down so that the delivery arm D1 can perform delivery of the wafer W with respect to the delivery stages TRS1 to TRS5.

A region existing between the transport region R1 and the interface block S3 is a second wafer delivery region R3. As shown in FIG. 7, a shelf unit U2 is installed in the second wafer delivery region R3 at a position to which the respective main arms A1 to A5 can gain access. Furthermore, a delivery arm D2 for performing delivery of the wafer W with respect to the shelf unit U2 is installed in the second wafer delivery region R3.

As shown in FIG. 9, delivery stages TRS6 to TRS10 are installed in the shelf unit U2 such that the wafer W can be delivered between the delivery stages TRS6 to TRS10 and the main arms A1 to A5 of the respective unit blocks B1 to B5. In the example shown in FIG. 9, one or more, e.g., two, delivery stages are installed with respect to each of the unit blocks B1 to B5. There is formed a delivery stage group in which the delivery stages are stacked at multiple stages.

The delivery arm D2 is configured to move forward and backward and to move up and down so that the delivery arm D2 can perform delivery of the wafer W with respect to the delivery stages TRS6 to TRS10.

The interface block S3 is installed at the rear side of the shelf unit U2 of the processing block S2. The exposure device S4 is installed at the rear side of the interface block S3. An interface arm E for performing delivery of the wafer W with respect to the shelf unit U2 of the processing block S2 and the exposure device S4 is disposed in the interface block S3.

The interface arm E constitutes a transport means which transports the wafer W between the processing block S2 and the exposure device S4. The interface arm E performs delivery of the wafer W with respect to the delivery stages TRS6 to TRS10 of the respective unit blocks B1 to B5. To this end, the interface arm E is configured such that it can move forward and backward, move up and down, and rotate about a vertical axis.

In the semiconductor manufacturing apparatus 100 according to the present embodiment, the delivery arm D1 and the delivery arm D2 can freely perform delivery of the wafer W between the unit blocks B1 to B5 stacked at five stages, via the delivery stages TRS1 to TRS5 and the delivery stages TRS6 to TRS10.

Furthermore, the semiconductor manufacturing apparatus 100 according to the present embodiment includes a controller 130 composed of a computer. The controller 130 controls the management of recipes of the respective processing units, the management of recipes of the transfer paths of the wafer W, the processes performed in the main modules M1 to M5 and the sub-modules Sb11 to Sb5N, and the operations of the main arms A1 to A5, the transfer arm C, the first and second delivery arms D1 and D2 and the interface arm E. The controller 130 performs the processes by transporting the wafer W through the use of the unit blocks B1 to B5.

Next, a description will be made on the configuration of the coating unit of the film forming module which constitutes the semiconductor manufacturing apparatus 100 of the present embodiment and which implements the film forming process of the present embodiment.

Figure 10A:
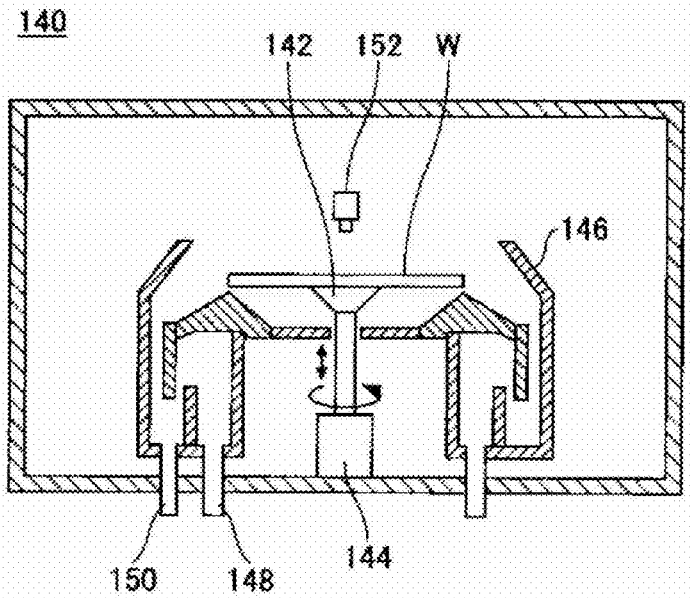
FIGS. 10A and 10B are schematic configuration views of a coating unit capable of performing a film forming process according to the present embodiment.
Figure 10B:
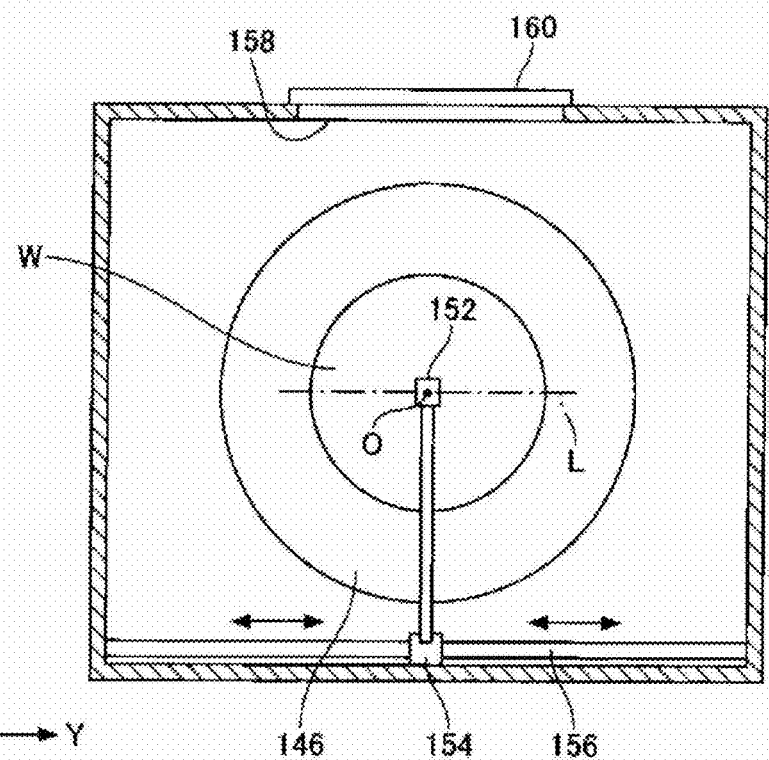

FIGS. 10A and 10B are schematic configuration views of the coating unit capable of implementing the film forming process according to the present embodiment. The coating unit 140 shown in FIGS. 10A and 10B is one example of a coating unit which is employed in a below-mentioned first example and configured to form a film 34 using a spin coating method. The coating unit 140 may be employed in the main module M3 of the third unit block B3 which performs a film forming process in the semiconductor manufacturing apparatus shown in FIGS. 7 to 9.

The coating unit 140 includes a substrate holding unit 142. The substrate holding unit 142 is a spin chuck and is configured to horizontally hold a wafer W by virtue of vacuum suction. The substrate holding unit 142 can be rotated about a vertical axis and can be moved up and down by a drive unit 144. A cup 146 extending in the up-down direction of the substrate holding unit 142 from the wafer W is installed around the substrate holding unit 142. Waste liquid parts such as an exhaust pipe 148 and a drain pipe 150 are installed on the bottom surface of the cup 146.

The coating unit 140 includes a nozzle 152 for supplying a coating solution which contains a precursor of the film 34. The nozzle 152 is installed substantially at the rotation center of the wafer W and is configured such that the nozzle 152 can be moved by a moving mechanism 154 along a guide member 156 installed along the longitudinal direction of the coating unit 140 and can be moved up and down.

The coating unit 140 further includes a wafer carry-in/carry-out port 158 formed on a surface facing a transport region where the main arm A3 is positioned. An opening/closing shutter 160 is installed in the wafer carry-in/carry-out port 158.

In the semiconductor device manufacturing method according to the present embodiment, the wafer W having a specified resist pattern 32 previously formed thereon is first delivered to the substrate holding unit 142 through the wafer carry-in/carry-out port 158 by the main arm A3. Then, the substrate holding unit 142 is rotated by the drive unit 144 while supplying a coating solution from the nozzle 152 to around the rotation center of the wafer W. The coating solution thus supplied is spread in the radial direction of the wafer W by a centrifugal force. The coating solution is supplied so as to cover the surface of the resist pattern 32.

The coated wafer W is subjected to a coating solution shaking-off process and a coating solution drying process. Thereafter, the wafer W is carried out from the coating unit 140 to a specified sub-module (e.g., a hot/cooling plate unit) through the wafer carry-in/carry-out port 158 by the main arm A3. Then, the wafer is subjected to a baking process, whereby the formation of the film 34 is completed.

The wafer W having the film 34 formed thereon is heated by a heating module such as a hot/cooling plate unit or the like, and may be heated to a temperature equal to or higher than a glass transition point. Consequently, the semiconductor device manufacturing method of the present embodiment is completed.

(First Example)

A description will be made on an example which demonstrates that a resist pattern superior in roughness characteristic and line width characteristic can be obtained by the semiconductor device manufacturing method of the present embodiment.

An anti-reflective film (BARC) as a base film was formed on a 8-inch semiconductor wafer. Then, a resist was coated on the BARC and was subjected to an exposure process and a developing process. Thus, a specified resist pattern (a line pattern) was obtained. The resist used at this time has a glass transition point of about 150 degrees. The LER of the resist pattern obtained at this time was 3.80 nm.

Then, TSAR-100 (made by Tokyo Ohka Kogyo Co., Ltd.) was coated on the wafer having the resist pattern formed thereon, by the aforementioned coating unit 140, under the coating conditions that the rotation speed is 1,000 rpm and the coating time is 10 seconds. Then, the coating solution was shaken off under the conditions that the rotation speed is 1,000 rpm and the time is 10 seconds. The coating solution was dried under the conditions that the rotation speed is 2,000 rpm and the time is 10 seconds and then under the conditions that the rotation speed is 3,000 rpm and the time is 10 seconds. Thereafter, the coating solution was baked, thereby forming a film which has elasticity and which has not compatibility with the resist.

The wafer having the film formed thereon was heated under the temperature condition of 100 degrees C., 150 degrees C., 200 degrees C. or 300 degrees C. Then, the heated wafer was cooled and was then cleaned for one minute with a 0.5% aqueous solution of hydrofluoric acid, thereby removing (delaminating) the film. The LER of the resist was measured with respect to the wafer from which the film is removed.

Figure 11:
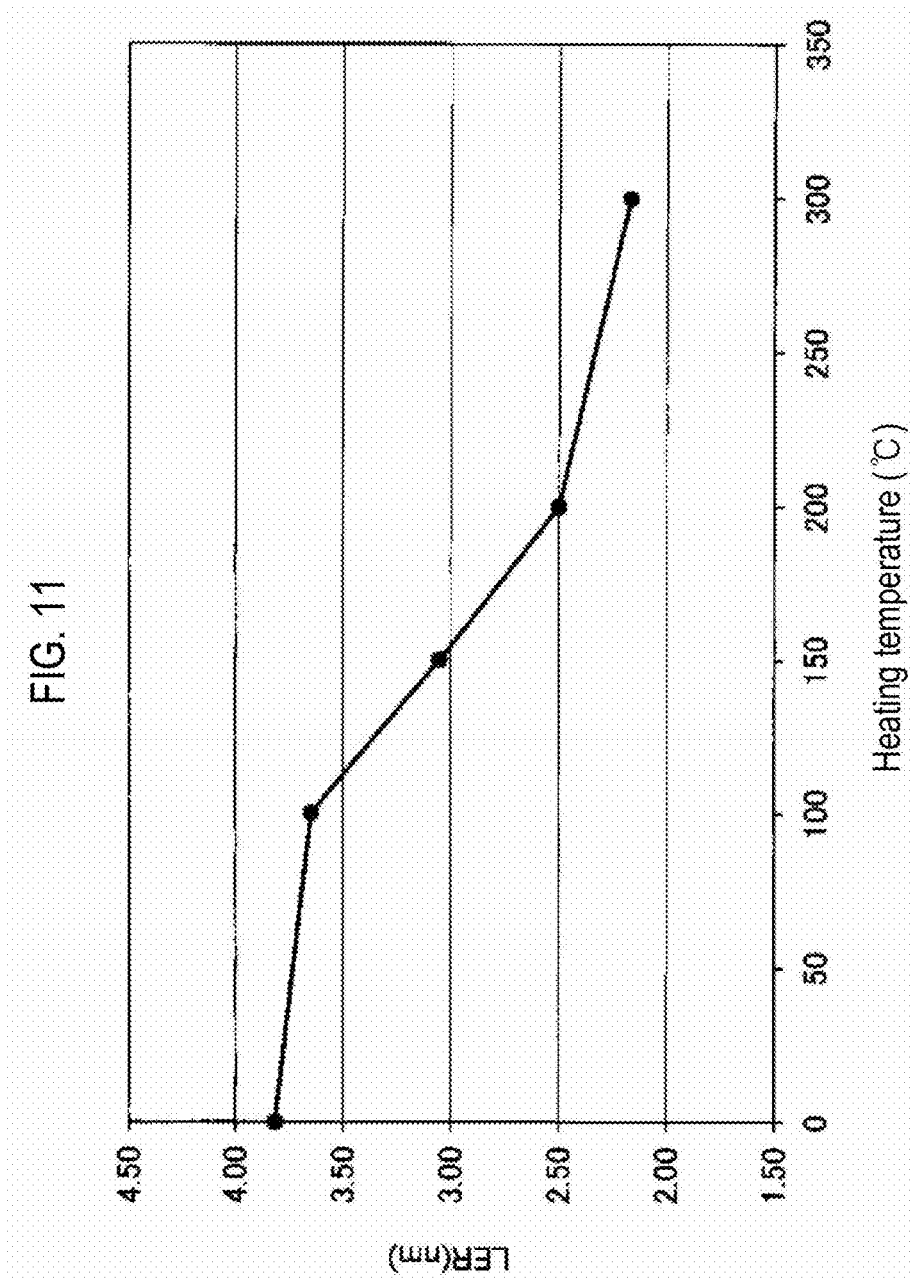
FIG. 11 is a schematic view for explaining the relationship between a heating process temperature and a line edge roughness in a first example.

FIG. 11 is a schematic view for explaining the relationship between a heating process temperature and an LER in the first example. The horizontal axis in FIG. 11 indicates the heat treatment temperature in the heating process. The vertical axis indicates the LER of the resist thus obtained.

As shown in FIG. 11, it was confirmed that the LER of the obtained resist can be reduced by heating the target object having the film formed thereon, after the film having elasticity and having no compatibility with the resist is formed.

The effect of reducing the LER tends to grow larger as the heating temperature in the heating process is made higher. Particularly, the LER of the resist became very small in the example in which the target object is heated to the glass transition point of the resist or higher (about 150 degrees C. or higher in this example) in the heating process. This is because the fluidity of the resist is increased by heating the target object to a high temperature, in some instances to a temperature equal to or higher than the glass transition point of the resist.

Figures 12A, 12B, 12C, 12D, 12E, 12F:
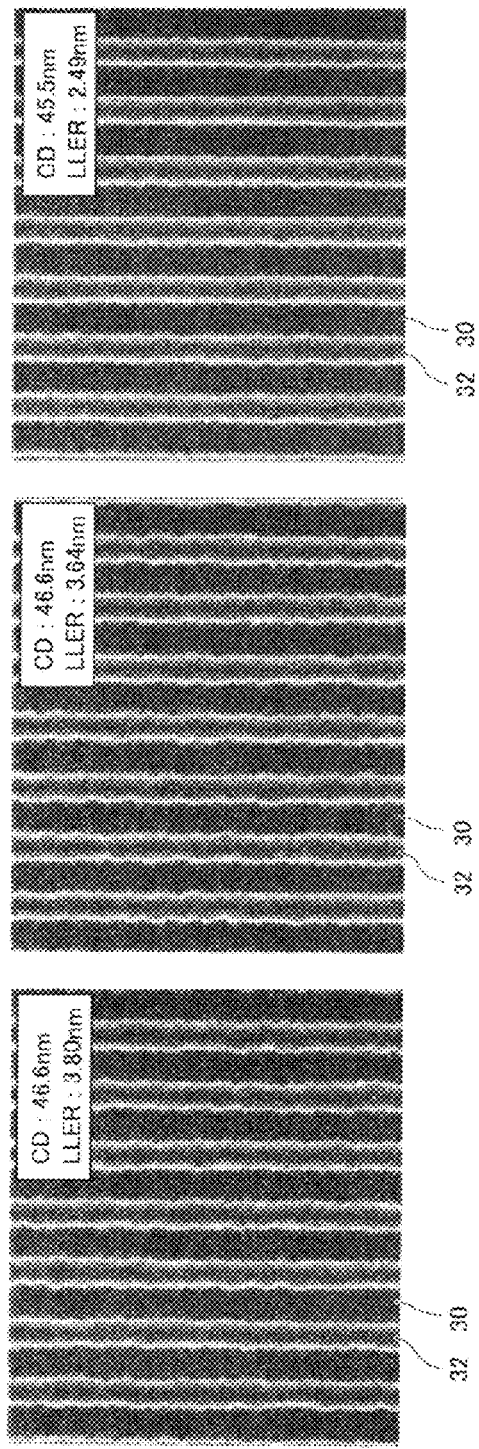
FIGS. 12A to 12F are examples of SEM images of a wafer obtained in the first example.

FIGS. 12A to 12F are examples of SEM images obtained in the first example. More specifically, FIG. 12A shows an SEM image of the upper surface of the wafer on which the resist is formed (LER=3.80 nm). FIG. 12B shows an SEM image of the upper surface of the wafer which has been subjected to the film forming process, the heating process (heating temperature=100 degrees C.) and the film removal process. FIG. 12C shows an SEM image of the upper surface of the wafer which has been subjected to the film forming process, the heating process (heating temperature=200 degrees C.) and the film removal process. FIG. 12D shows a perspective SEM image of the wafer on which the resist is formed (LER=3.80 nm). FIG. 12E shows a perspective SEM image of the wafer which has been subjected to the film forming process, the heating process (heating temperature=100 degrees C.) and the film removal process. FIG. 12F shows a perspective SEM image of the wafer which has been subjected to the film forming process, the heating process (heating temperature=200 degrees C.) and the film removal process.

In FIGS. 12A to 12C, there are indicated the CD values and the LER values of the resist obtained in the respective examples. The "LLER" in FIGS. 12A to 12C denotes an LER value of the left side surface in the resist of the SEM image.

As shown in FIGS. 12A to 12F, it can be noted that the semiconductor device manufacturing method of the present embodiment is a process which is capable of reducing the LER and which is small in the variation of the CD values.

While some embodiments of the present disclosure have been described above, the present disclosure is not limited to these specific embodiments but may be differently modified or changed without departing from the spirit of the present disclosure defined in the claims. For example, while the semiconductor device manufacturing method of the present embodiment has been described by taking, as an example, the case where the resist pattern as formed is a line pattern, the same technology can be applied to a case where the resist pattern as formed is a hole pattern. Thus, the present disclosure is not limited in this respect.

According to the present disclosure in some embodiments, it is possible to provide a manufacturing method of a semiconductor device which is superior in a roughness characteristic and a line width characteristic of a resist pattern.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A photo-lithographic processing method for semiconductor device manufacturing, comprising:
    forming a resist pattern on a target object;
    modifying a surface of the resist pattern into a film by deprotecting the target object, the film covering an entire unmodified portion of the resist pattern and having a glass transition temperature higher than a glass transition temperature of the surface of the resist pattern before the deprotecting; and
    heating the target object having the film,
    wherein a heating temperature during the heating is equal to or higher than a glass transition temperature of the resist pattern, and
    wherein modifying the surface of the resist pattern consists of only either exposing the target object having the resist pattern thereon with light or supplying an acid generating agent to the target object having the resist pattern thereon.

2. The method of claim 1, wherein forming the resist pattern includes exposing the target object with light, and
    wherein a wavelength of the light in the act of modifying the surface of the resist pattern is shorter than a wavelength of the light in the act of forming the resist pattern.

3. The method of claim 1, wherein the light has a wavelength of 184 nm, 172 nm, 157 nm, 146 nm or 126 nm.

4. The method of claim 1, wherein the acid generating agent includes an onium salt solution.

* * * * *